(12) United States Patent
Hsu

(10) Patent No.: US 8,143,526 B2
(45) Date of Patent: Mar. 27, 2012

(54) FLEXIBLE PRINTED CIRCUIT BOARD

(75) Inventor: Shou-Kuo Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 333 days.

(21) Appl. No.: 12/549,374

(22) Filed: Aug. 28, 2009

(65) Prior Publication Data

US 2011/0019371 A1 Jan. 27, 2011

(30) Foreign Application Priority Data

Jul. 24, 2009 (CN) .......................... 2009 1 0304779

(51) Int. Cl.
*H05K 1/00* (2006.01)
(52) U.S. Cl. ....................................... 174/254; 174/257
(58) Field of Classification Search .................. 174/254, 174/257, 260, 261
See application file for complete search history.

(56) References Cited

U.S. PATENT DOCUMENTS

| 5,003,273 A * | 3/1991 | Oppenberg ..................... 333/1 |
| 2005/0201072 A1* | 9/2005 | He et al. ........................ 361/794 |
| 2007/0040626 A1* | 2/2007 | Blair et al. ........................ 333/1 |

* cited by examiner

*Primary Examiner* — Yuriy Semenenko
(74) *Attorney, Agent, or Firm* — Altis Law Group, Inc.

(57) ABSTRACT

A flexible printed circuit board includes a differential pair arranged in a signal layer and two sheets defined in a ground layer. The two sheets are apart from each other by a void defined in the ground layer opposite to the differential pair. The differential pair includes a number of section pairs, each of which includes two sections arranged in two transmission lines of the differential pair respectively. The differential pair is equivalent to a low pass filter which includes several capacitors and several inductors. Each of the plurality of section pairs can achieve a desired characteristic impedance by adjusting a distance between each section and a corresponding nearest sheet, and a distance between the two sections of each of the plurality of section pairs.

5 Claims, 3 Drawing Sheets

FLEXIBLE PRINTED CIRCUIT BOARD

BACKGROUND

1. Technical Field

The present disclosure relates to printed circuit boards (PCBs), and particularly to a flexible printed circuit board (FPCB).

2. Description of Related Art

FPCBs are light, soft, thin, small, ductile, flexible and support high wiring density. FPCBs can be three-dimensionally wired and shaped according to space limitations. Flexible circuits are useful for electronic packages where flexibility, weight control and the like are important.

An FPCB may include a signal layer and a ground layer. Transmission lines may be arranged in the signal layer. Noise may be easily generated if the transmission lines are too close to the ground layer, which prevents the FPCB transmitting high speed signals. In addition, conventional FPCBs often have poor qualities for transmitting high speed signals because of failing to achieve required impedance.

DETAILED DESCRIPTION

Figure 1:
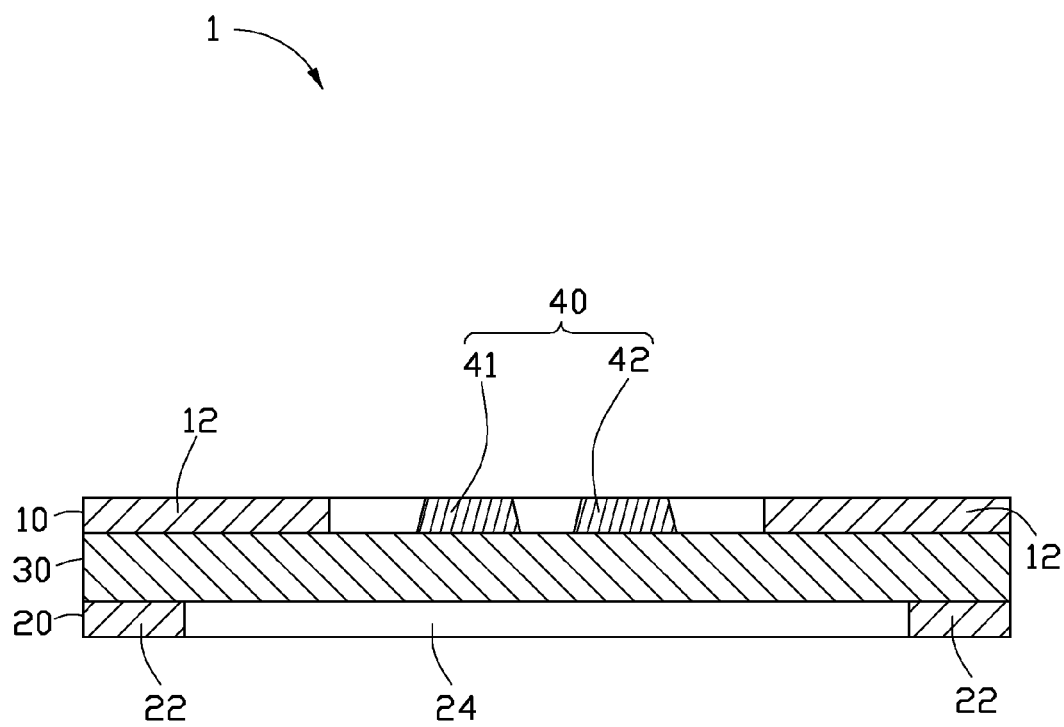
FIG. 1 is a cross-sectional view of a flexible printed circuit board (FPCB) according to an embodiment of the present invention, wherein the FPCB includes a differential pair.
Figure 2:
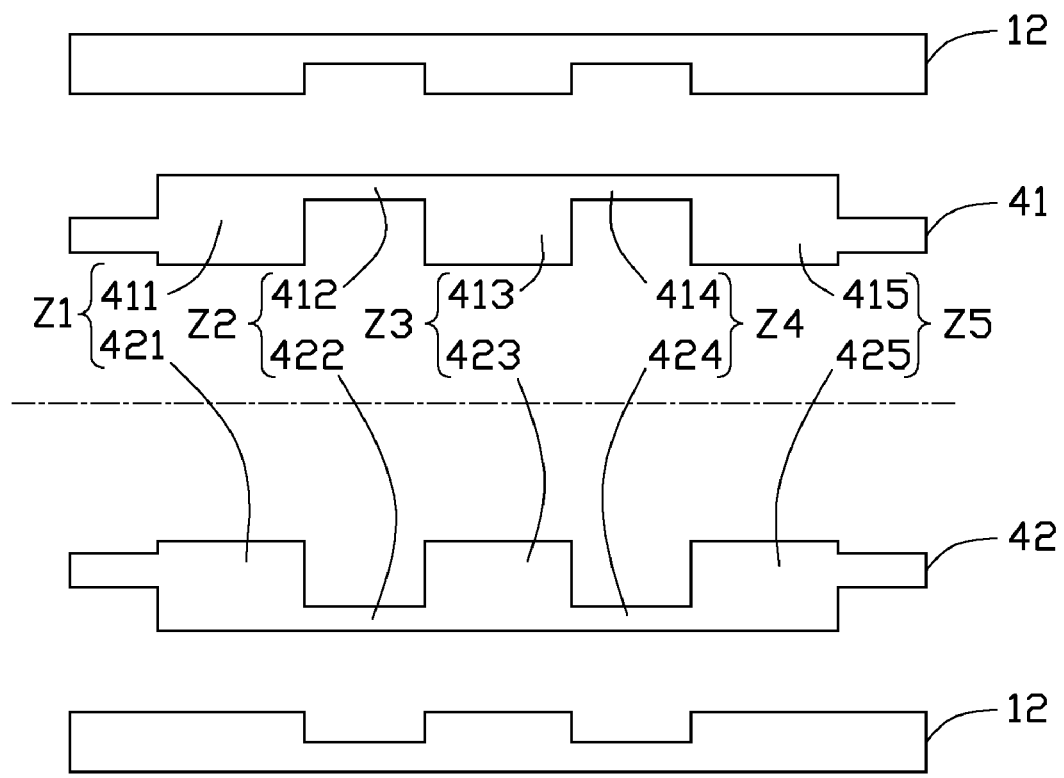
FIG. 2 is a top view of the FPCB of FIG. 1.

Referring to FIGS. 1 and 2, an embodiment of a flexible printed circuit board (FPCB) 1 includes a signal layer 10, a ground layer 20 adjacent to the signal layer 10. An insulating layer 30 made of dielectric material is arranged between the signal layer 10 and the ground layer 20. A differential pair 40 consisting of two transmission lines 41, 42 is arranged in the signal layer 10. Two first sheets 12 made of conductive material are correspondingly arranged at opposite sides of the differential pair 40 in the signal layer 10. The first sheets 12 are coupled to ground. Two second sheets 22 made of conductive material are arranged in the ground layer 20. The second sheets 22 are at a distance from each other, thereby, forming a void 24 in the ground layer 20 on a side of the insulating layer 30 opposite to the differential pair 40. The two second sheets 22 and the void 24 may be formed by cutting away material from conductive material covered on the ground layer 20 opposite to the differential pair 40. Therefore, low characteristic impedance of the transmission lines 41, 42, due to not enough distance between the differential pair 40 and each ground layer 20 can be prevented. The distance between the two second sheets 22 is adjustable according to preference. In this embodiment, the first sheets 12 and the second sheets 22 are made of copper, and are parallel to the transmission lines 41 and 42.

The differential pair 40 includes section pairs of aligned thick sections and pairs of aligned thin sections arranged in an alternating manner along each of the transmission lines 41, 42. Sections of each section pair have symmetrical structures. The differential pair 40 having the section pairs is equivalent to a low pass filter. A number of the section pairs of the differential pair 40 is predetermined depending on required specifications of the low pass filter. In this embodiment, there are five sections 411-415 defined in the transmission line 41, and five sections 421-425 defined in the transmission line 42, which form five section pairs Z1-Z5 correspondingly.

The two first sheets 12 are arranged at the opposite sides of the differential pair 40 symmetrically. Five sections is defined in each of the first sheets 12 opposite to the section pairs Z1-Z5 of the differential pair correspondingly. A width of each section of each of the section pairs Z1, Z3, and Z5 is greater than a width of each section of each of the section pairs Z2 and Z4.

Figure 3:
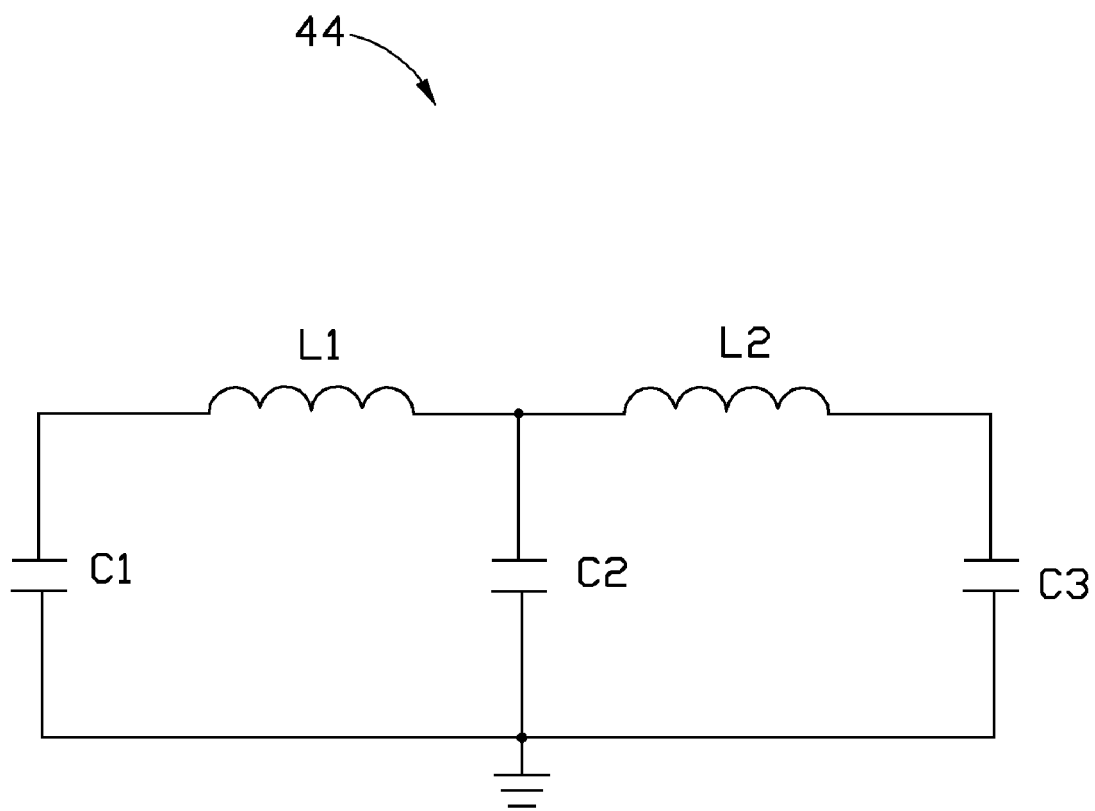
FIG. 3 is an equivalent circuit diagram of the differential pair of FIG. 1.

Referring to FIG. 3, the section pairs Z1, Z3, and Z5 are equivalent to three capacitors C1-C3 of a low pass filter 44. The sections Z2 and Z4 are equivalent to two inductors L1 and L2 of the low pass filter 44. The inductor L1 is connected between a first end of the capacitor C1 and a first end of the capacitor C2. The inductor L1 is connected between the first end of the capacitor C2 and a first end of the capacitor C3. A second end of each of the capacitors C1-C3 is grounded. A length of each section of each of the section pairs Z1, Z3, and Z5 is determined according to a first formula $$C = \frac{l}{Z_0 f \lambda_g},$$

and a length of each section of each of the section pairs Z2 and Z4 is determined according to a second formula $$L = \frac{Z_0 l}{f \lambda_g}.$$

Wherein C is a capacitance of the capacitor C1, C2 or C3 corresponding the section pairs Z1, Z3, and Z5, L is an inductance of the inductor L1 or L2 corresponding the section pairs Z2 and Z4, $Z_0$ is a desired characteristic impedance of the section pair Z1, Z2, Z3, Z4, or Z5, l is the length of each section of the section pair Z1, Z2, Z3, Z4, or Z5, f is a cut-off frequency of the low pass filter 44, $\lambda_g$ is a wavelength of signals transmitted on the differential pair 40 under the cut-off frequency. Values of the cut-off frequency and wavelength of the signals under the cut-off frequency are fixed. The capacitances of the capacitors C1-C3, the inductances of the inductors L1-L2 are predetermined. Therefore, the length of each section of each of the section pairs Z1-Z5 can be determined according the characteristic impedance of the section pairs Z1-Z5 correspondingly.

The desired characteristic impedance of each of the section pairs Z1-Z5 can be achieved by simulating the FPCB 1 of FIG. 1 in a conventional simulation software, simulating the signal type to be transmitted through the transmission lines 41 and 42 and the desired characteristic impedance of each of the section pairs Z1-Z5, and adjusting a first distance between the two sections of each of the section pairs Z1-Z5 and a second distance from each section of each of the transmission lines 41, 42, to a nearest sheet 12, until the desired characteristic impedance of each of the section pairs Z1-Z5 is achieved. In this embodiment, the first distance between the two sections of each of the section pairs Z1-Z5 and the second distance from each of the sections 411-415 and 421-425 to the corresponding nearest sheet 12 are adjusted by adjusting the width of each of the section 411-415 and 421-425 correspondingly. The second distance can also be adjusted by adjusting widths of each section of each of the first sheets 12 opposite to a corresponding section pairs of the differential pair.

Proper values of the first distance between the two sections of each of the section pairs Z1-Z5 and the second distance from each section to the corresponding nearest sheet 12 may enable the FPCB 1 to achieve the desired characteristic impedance of each of the section pairs Z1-Z5 of the differential pair 40, therefore, the FPCB 1 can transmit high speed signals with little noise.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A flexible printed circuit board (FPCB) comprising:
    a signal layer, wherein a differential pair comprising two transmission lines is arranged in the signal layer, and two first sheets made of a conductive material are arranged at opposite sides of the differential pair in the signal layer symmetrically, the two first sheets are parallel to the two transmission lines, and are coupled to ground;
    a ground layer, wherein two second sheets made of a conductive material are arranged in the ground layer; the two second sheets are at a distance from each other to form a void in the ground layer opposite to the differential pair; and
    an insulating layer made of a dielectric material and arranged between the signal layer and the ground layer;
    wherein the differential pair comprises a plurality of section pairs, each of the plurality of section pairs comprises two sections arranged in the two transmission lines symmetrically, every two adjacent sections of each of the two transmission lines are different in width, each of the plurality of section pairs has a desired characteristic impedance relative to a predetermined distance between each of the two sections of each of the plurality of section pairs and a corresponding nearest first sheet, and a predetermined distance between the two sections of each of the plurality of section pairs.

2. The FPCB of claim 1, wherein the first and second sheets are made of copper.

3. The FPCB of claim 1, wherein every two adjacent section pairs are equivalent to a capacitor and an inductor of a low pass filter, each section of the section pairs which are equivalent to the capacitors has a greater width than each section of the section pairs which are equivalent to the inductors.

4. The FPCB of claim 3, wherein a length of each section of the section pairs which are equivalent to the capacitors is determined according to a first formula $$C = \frac{l}{Z_0 f \lambda_g},$$

and a length of each section of the section pairs which are equivalent to the inductors is determined according to a second formula $$L = \frac{Z_0 l}{f \lambda_g},$$

wherein C is a capacitance of each of the capacitors, L is an inductance of each of the inductors, $Z_0$ is the desired characteristic impedance of each of the plurality of section pairs, l is the length of each section of each of the plurality of section pairs, f is a cut-off frequency of the low pass filter, $\lambda_g$ is a wavelength of signals transmitted on the differential pair under the cut-off frequency.

5. A flexible printed circuit board comprising:
    a signal layer, wherein a differential pair comprising two transmission lines is arranged in the signal layer, and two sheets made of a conductive material are arranged at opposite sides of the differential pair in the signal layer and coupled to ground;
    a ground layer, wherein a void is defined in the ground layer by removing a conductive material of the ground layer opposite to the differential pair; and
    an insulating layer made of a dielectric material and arranged between the signal layer and the ground layer;
    wherein the differential pair comprises a plurality of section pairs of aligned sections, the aligned sections comprises thick sections and thin sections arranged in an alternating manner along the differential pair, sections of each section pair have symmetrical structures, a plurality of sections is defined in each of the two sheets opposite to the plurality of section pairs correspondingly, each section pair has a desired characteristic impedance relative to a width of each section of the section pair, and a width of each section of the two sheets opposite to the corresponding section pair.

* * * * *